(12) United States Patent
Wang et al.

(10) Patent No.: US 8,198,800 B2
(45) Date of Patent: Jun. 12, 2012

(54) LED CHIP PACKAGE STRUCTURE IN ORDER TO PREVENT THE LIGHT-EMITTING EFFICIENCY OF FLUORESCENT POWDER FROM DECREASING DUE TO HIGH TEMPERATURE AND METHOD FOR MAKING THE SAME

(75) Inventors: Bily Wang, Hsinchu (TW); Shih-Yu Wu, Banciao (TW); Wen-Kuei Wu, Hukou Township, Hsinchu County (TW)

(73) Assignee: Harvatek Corporation, Hsinchu (TW)

( * ) Notice: Subject to any disclaimer, the term of this patent is extended or adjusted under 35 U.S.C. 154(b) by 736 days.

(21) Appl. No.: 12/232,931

(22) Filed: Sep. 26, 2008

(65) Prior Publication Data
US 2009/0224653 A1  Sep. 10, 2009

(30) Foreign Application Priority Data
Mar. 7, 2008 (TW) .............................. 97108013 A

(51) Int. Cl.
*H01J 1/62* (2006.01)
*H01J 63/04* (2006.01)
(52) U.S. Cl. ................... 313/498; 257/88; 257/E33.061
(58) Field of Classification Search .................. 313/512, 313/498, 501, 503; 257/98, 91, 95, E33.059, 257/E33.061
See application file for complete search history.

(56) References Cited

U.S. PATENT DOCUMENTS

| | | | |
|---|---|---|---|
| 6,653,661 B2 * | 11/2003 | Okazaki | 257/98 |
| 6,945,672 B2 * | 9/2005 | Du et al. | 362/241 |
| 7,075,116 B2 * | 7/2006 | Okazaki | 257/98 |
| 2002/0123163 A1 * | 9/2002 | Fujii | 438/26 |
| 2004/0169187 A1 * | 9/2004 | Fujii | 257/98 |
| 2005/0212397 A1 * | 9/2005 | Murazaki et al. | 313/487 |
| 2006/0097385 A1 * | 5/2006 | Negley | 257/722 |
| 2008/0002100 A1 * | 1/2008 | Kaneko et al. | 349/65 |
| 2008/0128714 A1 * | 6/2008 | Pang et al. | 257/88 |
| 2009/0020770 A1 * | 1/2009 | Wang et al. | 257/91 |

FOREIGN PATENT DOCUMENTS

| JP | 2000315826 A | * | 11/2000 |
|---|---|---|---|
| JP | 3138755 U | * | 1/2008 |

OTHER PUBLICATIONS

Machine English Translation of JP 2000315826A.*
Machine English Translation of JP 3138755 U.*

* cited by examiner

*Primary Examiner* — Mariceli Santiago
*Assistant Examiner* — Glenn Zimmerman
(74) *Attorney, Agent, or Firm* — Rosenberg, Klein & Lee

(57) ABSTRACT

An LED chip package structure in order to prevent the light-emitting efficiency of fluorescent powder from decreasing due to high temperature includes a substrate unit, a light-emitting unit, a transparent colloid body unit, a fluorescent colloid body unit and a frame unit. The light-emitting unit has a plurality of LED chips electrically arranged on the substrate unit. The transparent colloid body unit has a plurality of transparent colloid bodies respectively covering the LED chips. The fluorescent colloid body unit has a plurality of fluorescent colloid bodies respectively covering the transparent colloid bodies. The frame unit is covering the peripheries of each transparent colloid body and each fluorescent colloid body in order to expose the top surfaces of the fluorescent colloid body.

3 Claims, 18 Drawing Sheets

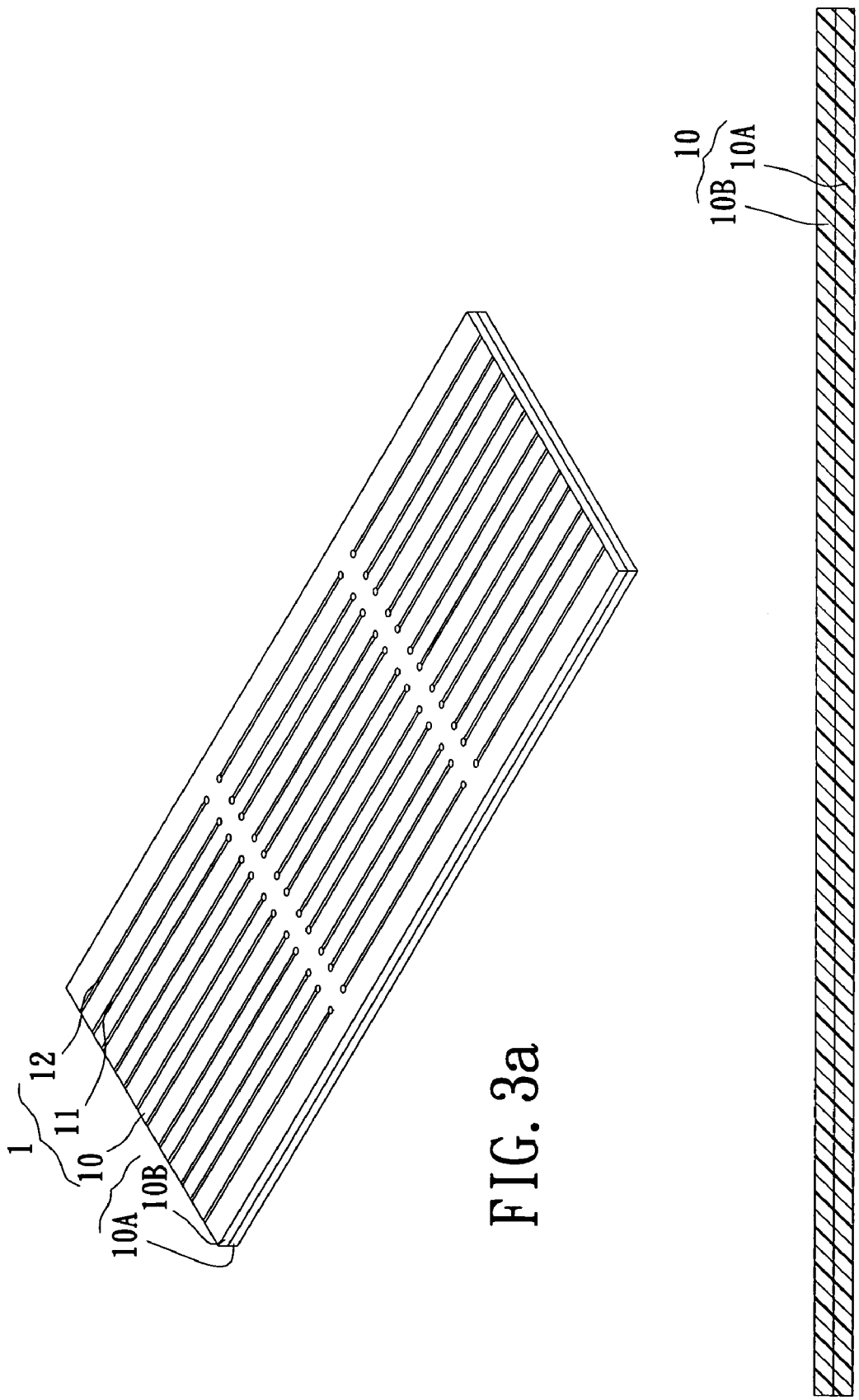

| providing a substrate unit that has a substrate body, and a positive trace and a negative trace respectively formed on the substrate body | S200 |

↓

| arranging a plurality of LED chips on the substrate body via a matrix method to form a plurality of longitudinal LED chip rows, each LED chip having a positive side and a negative side respectively and electrically connected with the positive trace and the negative trace of the substrate unit | S202 |

↓

| longitudinally and respectively covering the longitudinal LED chip rows with a plurality of elongated transparent colloid bodies via a first mold unit | S204 |

↓

| longitudinally and respectively covering the top surfaces of the elongated transparent colloid bodies with a plurality of elongated fluorescent colloid bodies | S206 |

↓

| transversely cutting the elongated transparent colloid bodies and the elongated fluorescent colloid bodies along a line between each two adjacent and longitudinal LED chips to form a plurality of transparent colloid bodies that are separated from each other and respectively covering the LED chips and a plurality of fluorescent colloid bodies that are separated from each other and respectively covering the transparent colloid bodies | S208 |

↓

| covering substrate body with a frame unit via a third mold unit, and the frame unit formed around the peripheries of each transparent colloid body and each fluorescent colloid body | S210 |

↓

| transversely cutting the frame unit and the substrate body along a line between each two adjacent and longitudinal LED chips to form a plurality of light bars, and each light bar having a frame layer covering the peripheries of each transparent colloid body and each fluorescent colloid body | S212 |

FIG. 5

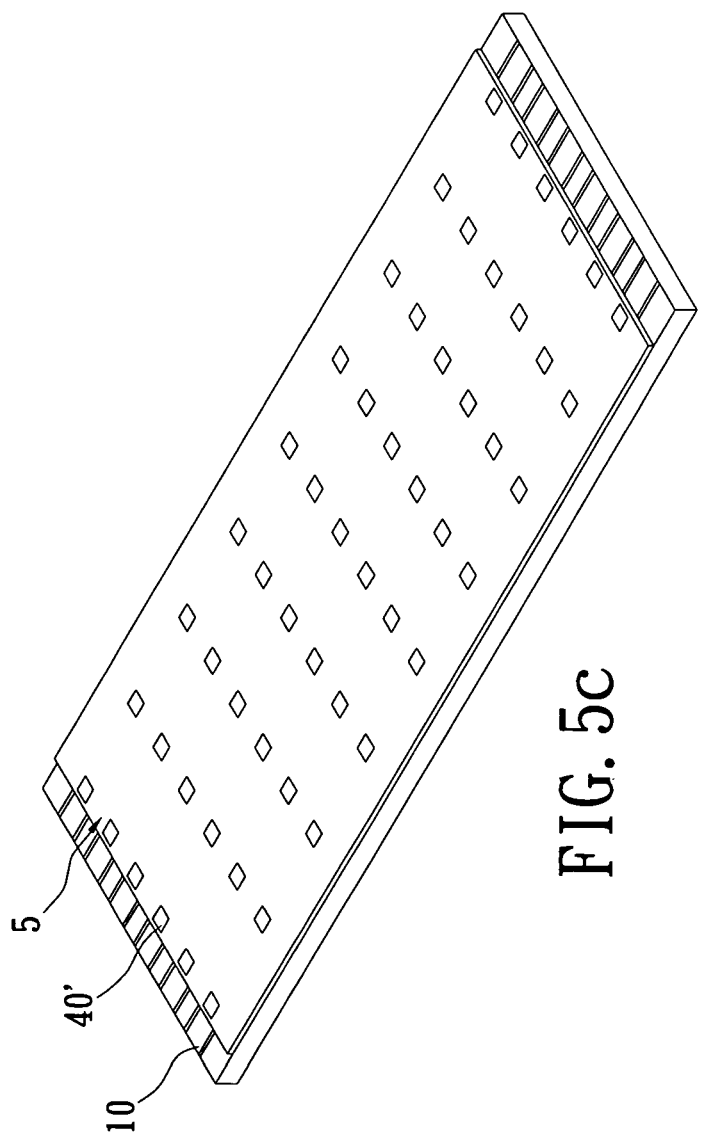
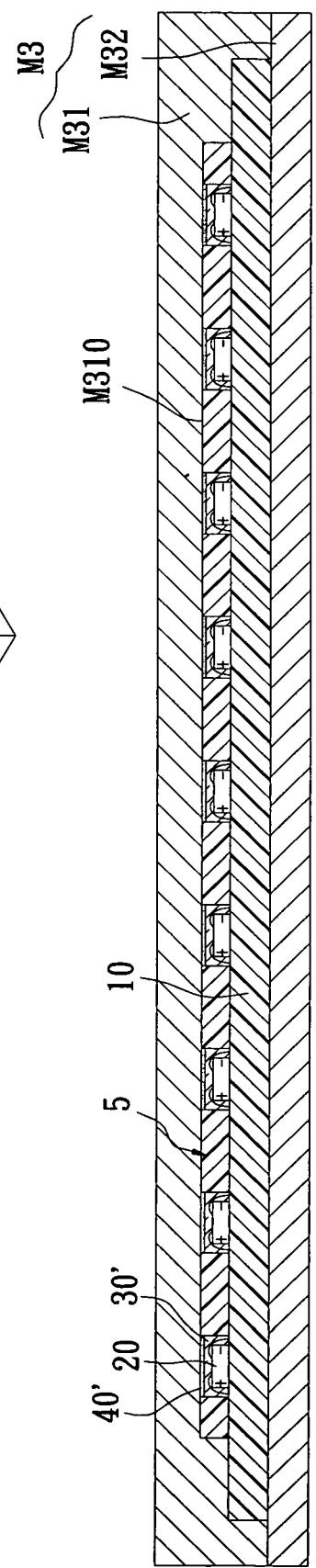
FIG. 5c
FIG. 5C

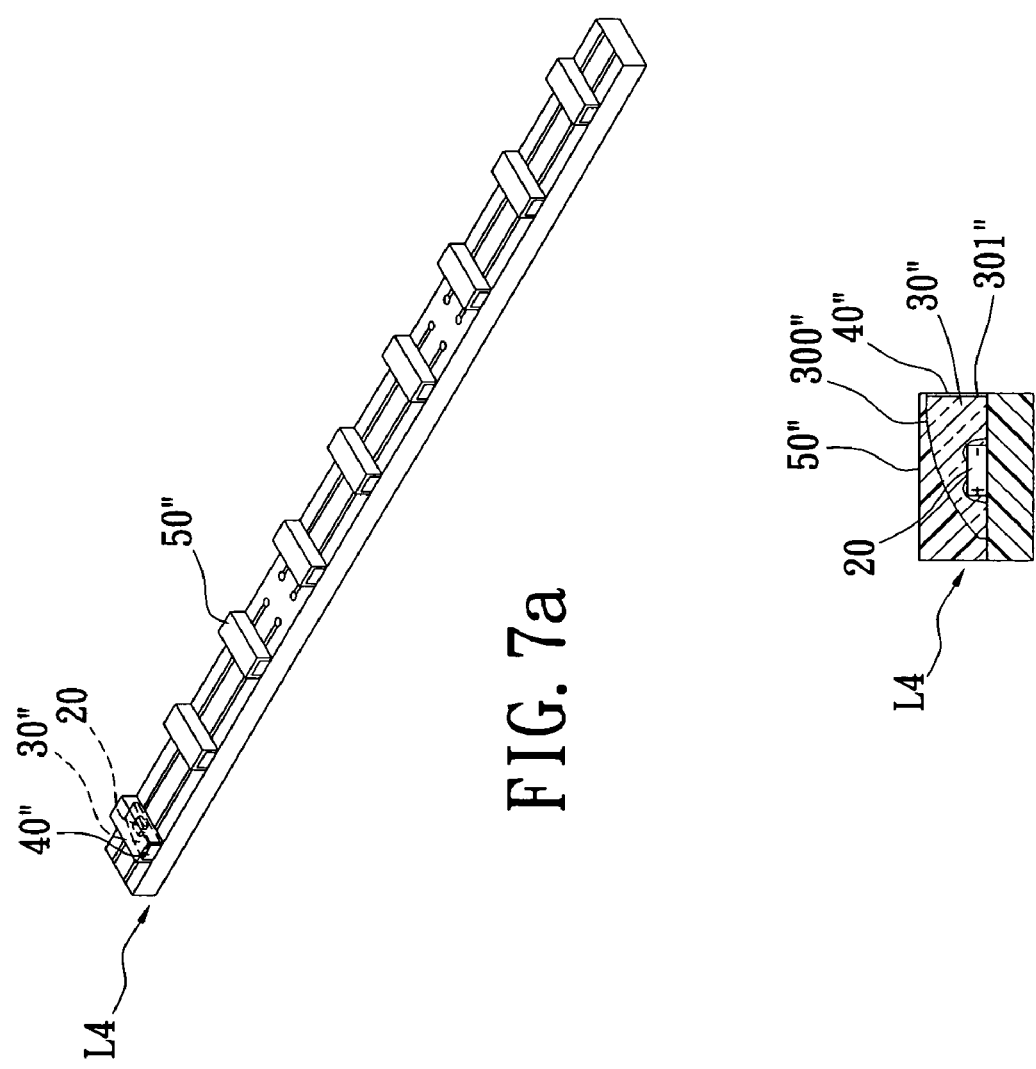

LED CHIP PACKAGE STRUCTURE IN ORDER TO PREVENT THE LIGHT-EMITTING EFFICIENCY OF FLUORESCENT POWDER FROM DECREASING DUE TO HIGH TEMPERATURE AND METHOD FOR MAKING THE SAME

BACKGROUND OF THE INVENTION

1. Field of the Invention

The present invention relates to an LED chip package structure and a method of packaging the same, and particularly relates to an LED chip package structure in order to prevent the light-emitting efficiency of fluorescent powder from decreasing due to high temperature and a method for making the same.

2. Description of the Related Art

Referring to FIG. 1, a known first method for packaging LED chips is shown. The known first method includes: providing a plurality of LEDs that have been packaged (S800); providing an elongated substrate body that has a positive trace and a negative trace (S802); and then, arranging each LED on the elongated substrate body in sequence and electrically connecting a positive electrode side and a negative electrode side of each LED with the positive trace and the negative trace of the substrate body (S804).

Referring to FIG. 2, a known second method for packaging LED chips is shown. The known second method includes: providing an elongated substrate body that has a positive trace and a negative trace (S900); arranging a plurality of LED chips on the elongated substrate body in sequence and electrically connecting a positive electrode side and a negative electrode side of each LED chip with the positive trace and the negative trace of the substrate body (S902); and then, covering the substrate body and the LED chips with an elongated fluorescent colloid body to form a light bar with an elongated light-emitting area (S904).

However, With regards to the known first method, each LED needs to be firstly cut from an entire LED package structure, and then each LED is arranged on the elongated substrate body via SMT process. Hence, the known first packaging process is time-consuming. Moreover, because the fluorescent colloid bodies are separated from each other, a dark band is easily produced between the two fluorescent colloid bodies and the two LEDs. Hence, the known LED package structure does not offer a good display for users. Moreover, because the fluorescent colloid bodies of the LEDs are separated from each other, a dark band is easily produced between each two fluorescent colloid bodies and each two LEDs. Hence, the known first LED package structure does not offer a good display for users.

With regards to the known second method, because the light bar produces the elongated light-emitting area, no dark band is produced. However, the triggered area of the elongated fluorescent body is not uniform, so the light-emitting efficiency of the light bar is not good. In other words, one partial package area of the elongated fluorescent body close to the LED chips generates a stronger triggered light, and the other partial package area of the elongated fluorescent body separated from the LED chips generates a weaker triggered light.

Moreover, when fluorescent colloid bodies are directly formed on the LED chips, the heat generated by the LED chips reduces the quality of the fluorescent colloid bodies. Hence, the light-emitting efficiency of the fluorescent colloid bodies is decreased due to high temperature of the LED chips.

SUMMARY OF THE INVENTION

The present invention provides an LED chip package structure in order to prevent the light-emitting efficiency of fluorescent powder from decreasing due to high temperature and a method for making the same. When the LED chip package structure of the present invention lights up, the LED chip package structure generates a series of light-generating areas on a colloid body unit. Because the series of light-generating areas is continuous, no dark bands are produced between each two LED chips. Furthermore, because the LED chips are arranged on a substrate body via a COB (Chip On Board) method and a hot pressing method, the process for the LED chip package structure is simple and less time is needed for the manufacturing process.

Moreover, because fluorescent colloid bodies cannot directly touch the LED chips, the present invention can prevent the light-emitting efficiency of fluorescent powder from decreasing due to high temperature.

Furthermore, the LED chip package structure can be applied to any type of light source such as a back light module, a decorative lamp, a lighting lamp, or a scanner.

A first aspect of the present invention is a method for making an LED chip package structure in order to prevent the light-emitting efficiency of fluorescent powder from decreasing due to high temperature, comprising: providing a substrate unit; electrically arranging a plurality of LED chips on the substrate unit via a matrix method to form a plurality of longitudinal LED chip rows; longitudinally and respectively covering the longitudinal LED chip rows with a plurality of elongated transparent colloid bodies; longitudinally and respectively covering the whole elongated transparent colloid bodies with a plurality of elongated fluorescent colloid bodies; and transversely cutting the elongated transparent colloid bodies, the elongated fluorescent colloid bodies and the substrate unit along a line between each two adjacent and longitudinal LED chips to form a plurality of light bars, and each light bar having a plurality of transparent colloid bodies that are separated from each other and respectively covering the LED chips and a plurality of fluorescent colloid bodies that are separated from each other and respectively covering the transparent colloid bodies.

A second aspect of the present invention is an LED chip package structure in order to prevent the light-emitting efficiency of fluorescent powder from decreasing due to high temperature, comprising: a substrate unit, a light-emitting unit, a transparent colloid body unit, a fluorescent colloid body unit and a frame unit.

Moreover, the light-emitting unit has a plurality of LED chips electrically arranged on the substrate unit. The transparent colloid body unit has a plurality of transparent colloid bodies respectively covering the LED chips. The fluorescent colloid body unit has a plurality of fluorescent colloid bodies respectively covering the transparent colloid bodies. The frame unit is covering the peripheries of each transparent colloid body and each fluorescent colloid body in order to expose the top surfaces of the fluorescent colloid body.

Therefore, because the series of light-generating areas are continuous, no dark bands are produced between each two LED chips. Furthermore, because the LED chips are arranged on the substrate body via a COB (Chip On Board) method and a hot pressing method, the process of the present invention is simple and so reduces the required manufacturing time.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIGS. 3a to 3e are perspective, schematic diagrams of a packaging process according to the first embodiment of the present invention, respectively;

FIGS. 3A to 3E are cross-sectional diagrams of a packaging process according to the first embodiment of the present invention, respectively;

FIG. 5 is a flowchart of a method for making an LED chip package structure according to the second embodiment of the present invention;

FIGS. 5a to 5d are partial perspective, schematic diagrams of a packaging process according to the second embodiment of the present invention, respectively;

FIGS. 5A to 5D are partial cross-sectional diagrams of a packaging process according to the second embodiment of the present invention, respectively;

FIGS. 6A to 6B are partial cross-sectional diagrams of a packaging process according to the third embodiment of the present invention, respectively;

FIG. 7a is perspective, schematic diagram of an LED chip package structure in order to prevent the light-emitting efficiency of fluorescent powder from decreasing due to high temperature according to the fourth embodiment of the present invention; and FIG. 7A is a cross-sectional diagram of an LED chip package structure in order to prevent the light-emitting efficiency of fluorescent powder from decreasing due to high temperature according to the fourth embodiment of the present invention.

DETAILED DESCRIPTION OF PREFERRED BEST MOLDS

Referring to FIGS. 3, 3a to 3e, and 3A to 3E, the first embodiment of the present invention provides a method for making an LED chip package structure in order to prevent the light-emitting efficiency of fluorescent powder from decreasing due to high temperature.

The method includes: referring to FIGS. 3a and 3A, providing a substrate unit 1 that has a substrate body 10, and a positive trace 11 and a negative trace 12 respectively formed on the substrate body 10 (S100).

The substrate body 10 has a metal layer 10A and a Bakelite layer 10B formed on the metal layer 10B. The substrate unit 1 can be a PCB (Printed Circuit Board), a flexible substrate, an aluminum substrate, a ceramic substrate, or a copper substrate according to different design needs. In addition, both the positive trace 11 and the negative trace 12 can be aluminum circuits or silver circuits. The layouts of the positive trace 11 and the negative trace 12 are determined by different needs.

Figure 1:
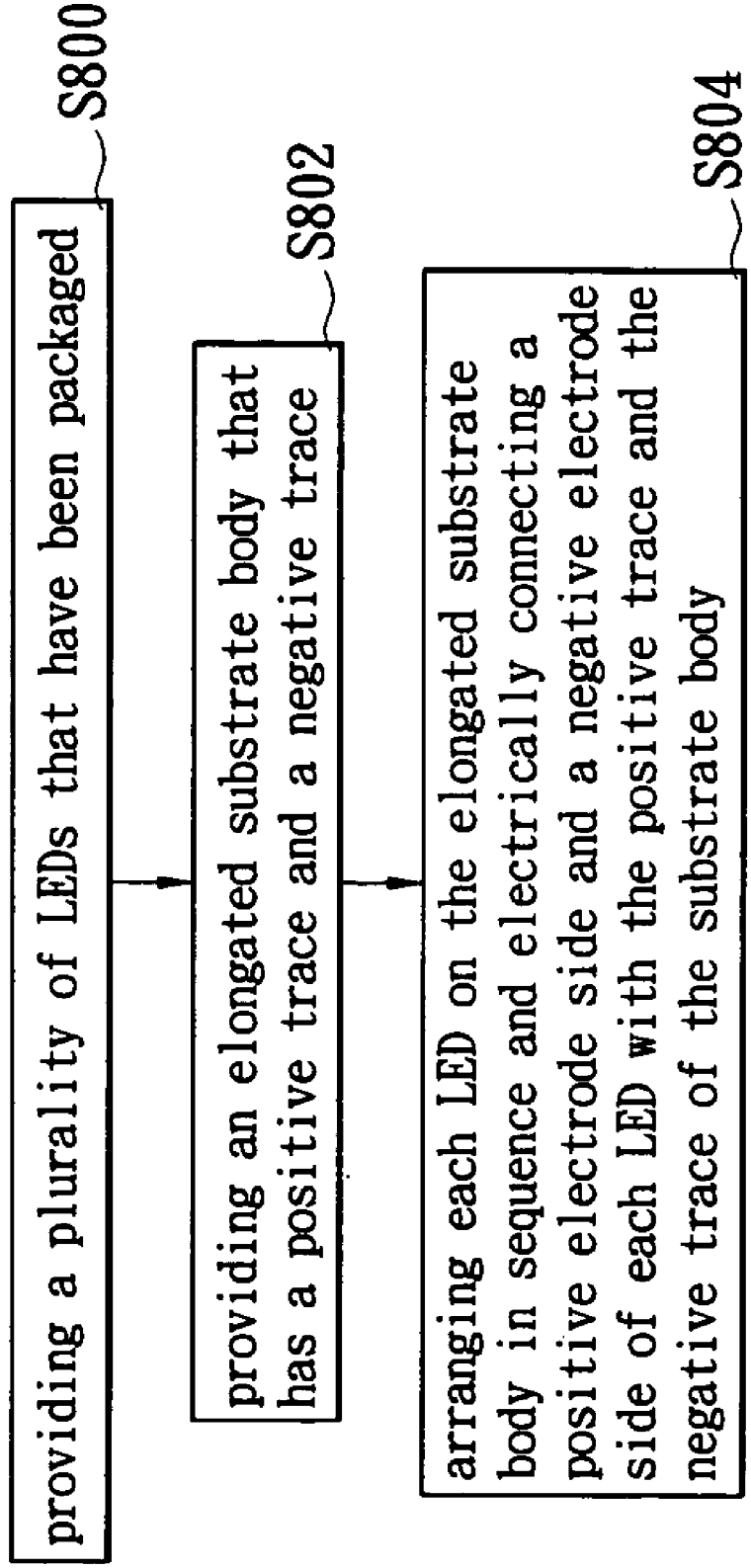
FIG. 1 is a flowchart of a first method for making LED chips of the prior art.
Figure 2:
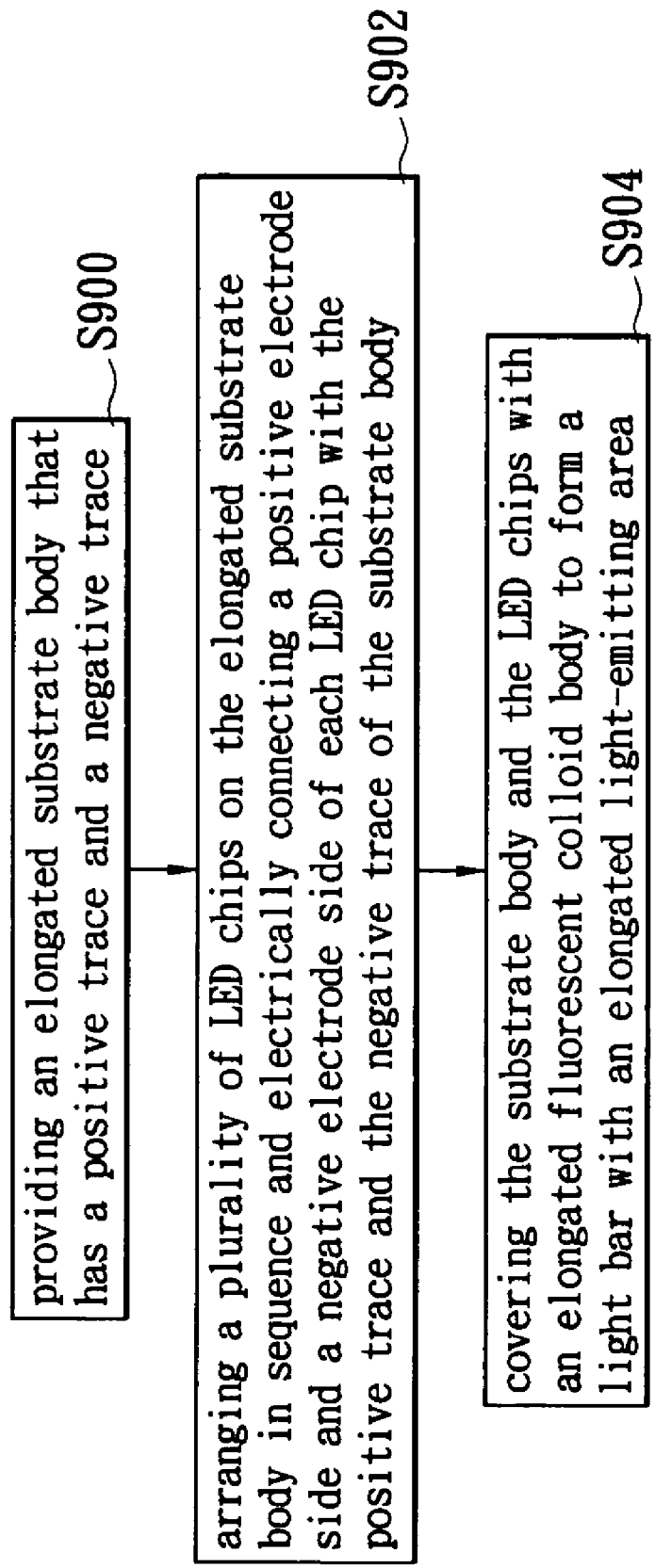
FIG. 2 is a flowchart of a second method for making LED chips of the prior art.
Figure 3:
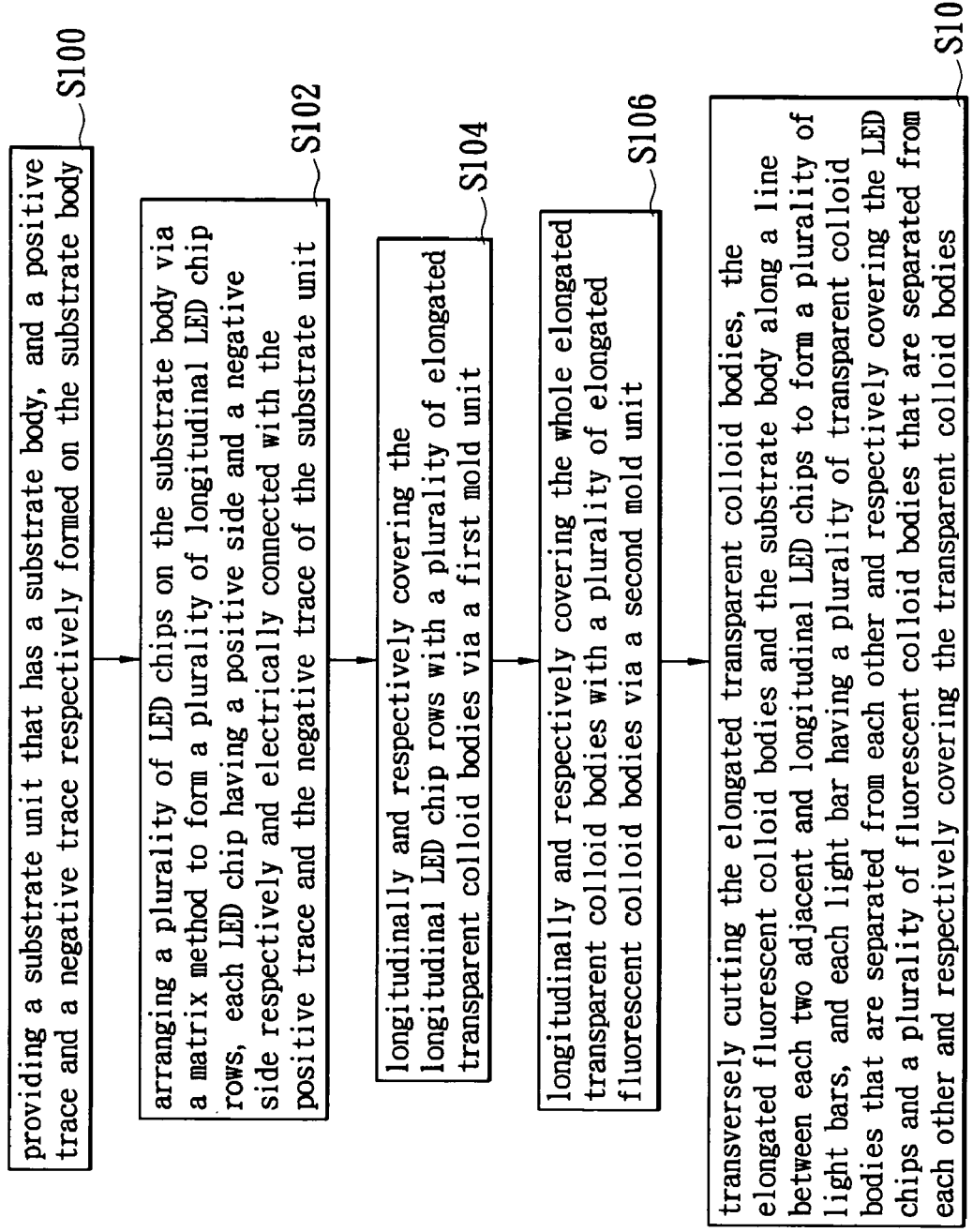
FIG. 3 is a flowchart of a method for making an LED chip package structure according to the first embodiment of the present invention.
Figure 3B:
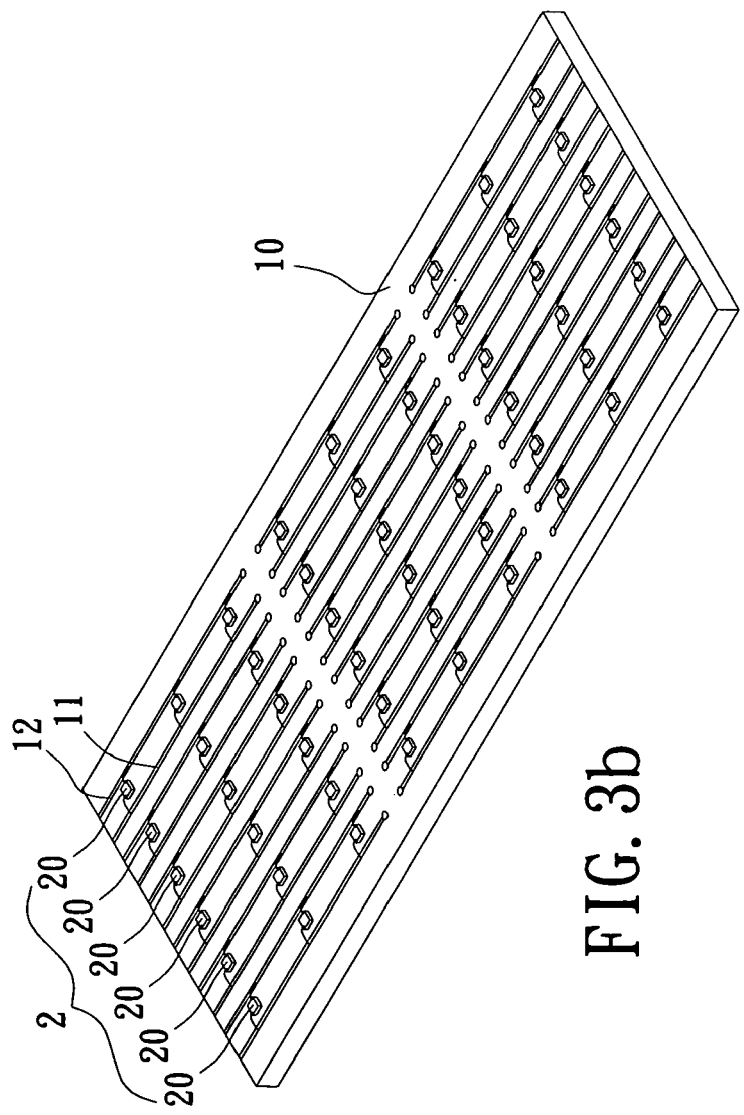
Figure 3B:
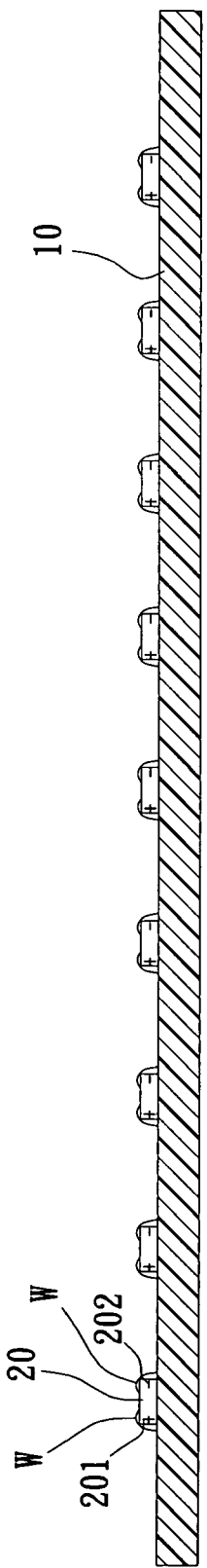

Referring to FIGS. 3b and 3B, the method of the first embodiment further includes: arranging a plurality of LED chips 20 on the substrate body 10 via a matrix method to form a plurality of longitudinal LED chip rows 2, each LED chip 20 having a positive side 201 and a negative side 202 respectively and electrically connected with the positive trace 11 and the negative trace 12 of the substrate unit 1 (S102).

In the first embodiment, the positive side 201 and the negative side 202 of each LED chip 20 are respectively and electrically connected with the positive trace 11 and the negative trace 12 of the substrate unit 1 via two corresponding leading wires W by a wire-bounding method. Moreover, each longitudinal LED chip row 2 is straightly arranged on the substrate body 10 of the substrate unit 1. Each LED chip 20 can be a blue LED chip.

Figure 4:
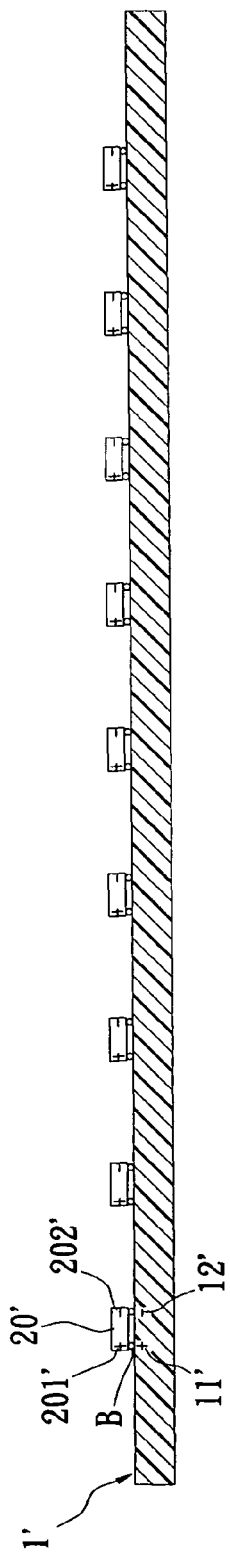
FIG. 4 is a schematic view of LED chips electrically connected on a substrate body via a flip-chip method.

However, the above-mentioned method of electrically connecting the LED chips 20 should not be used to limit the present invention. For example, referring to FIG. 4, the positive side 201' and the negative side 202' of each LED chip 20' respectively and electrically connected with the positive trace 11' and the negative trace 12' of the substrate unit 1' via a plurality of corresponding solder balls B by a flip-chip method. Moreover, according to different needs, positive sides and negative sides of LED chips (not shown) can be electrically connected to a positive trace and a negative trace of a substrate unit (not shown) via parallel, serial, or parallel and serial method.

Figure 3C:
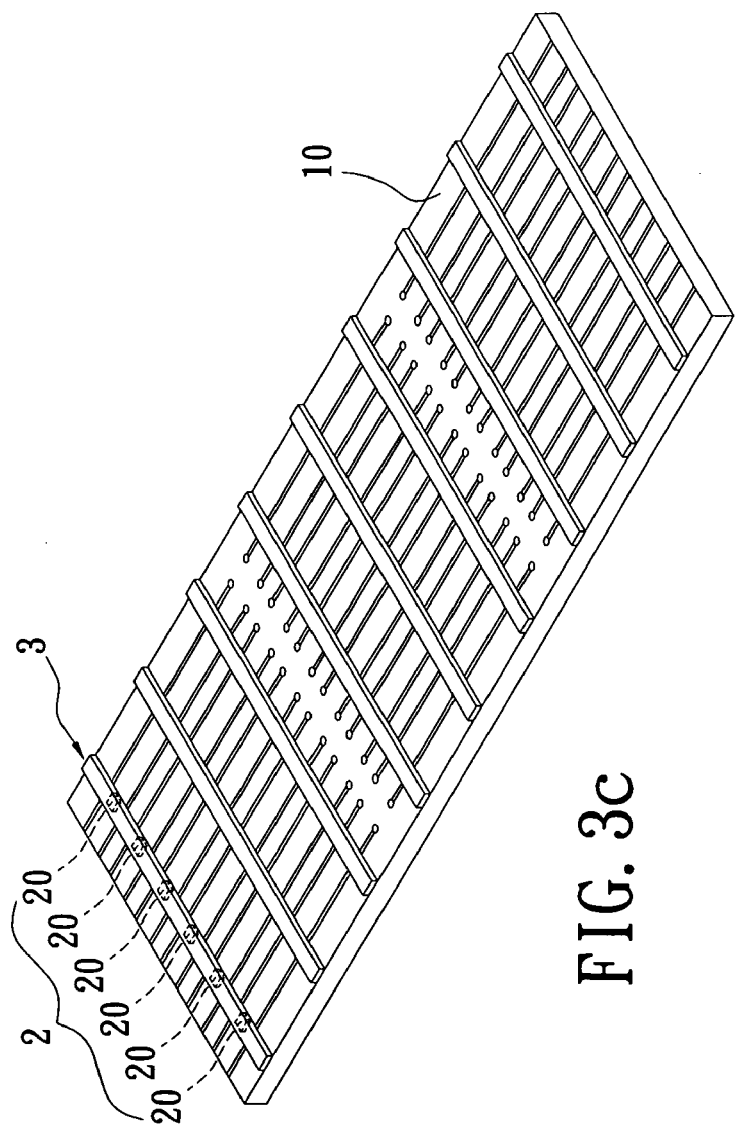
Figure 3C:
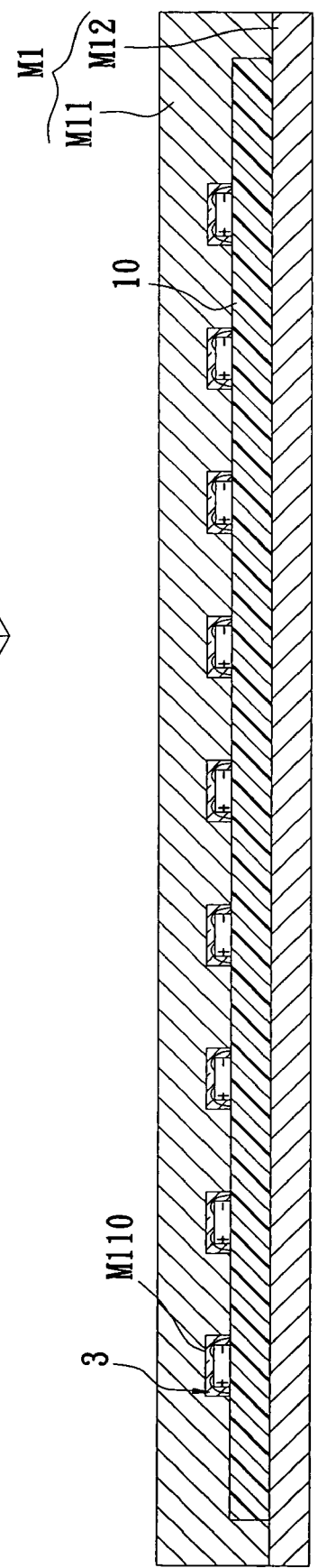

Referring to FIGS. 3c and 3C, the method of the first embodiment further includes: longitudinally and respectively covering the longitudinal LED chip rows 2 with a plurality of elongated transparent colloid bodies 3 via a first mold unit M1 (S104).

The first mold unit M1 is composed of a first upper mold M11 and a first lower mold M12 for supporting the substrate body 10. The first upper mold M11 has a plurality of first channels M110 corresponding to the longitudinal LED chip rows 2. In addition, the height and the width of each first channel M10 are equal to the height and the width of each elongated transparent colloid body 3.

Figure 3D:
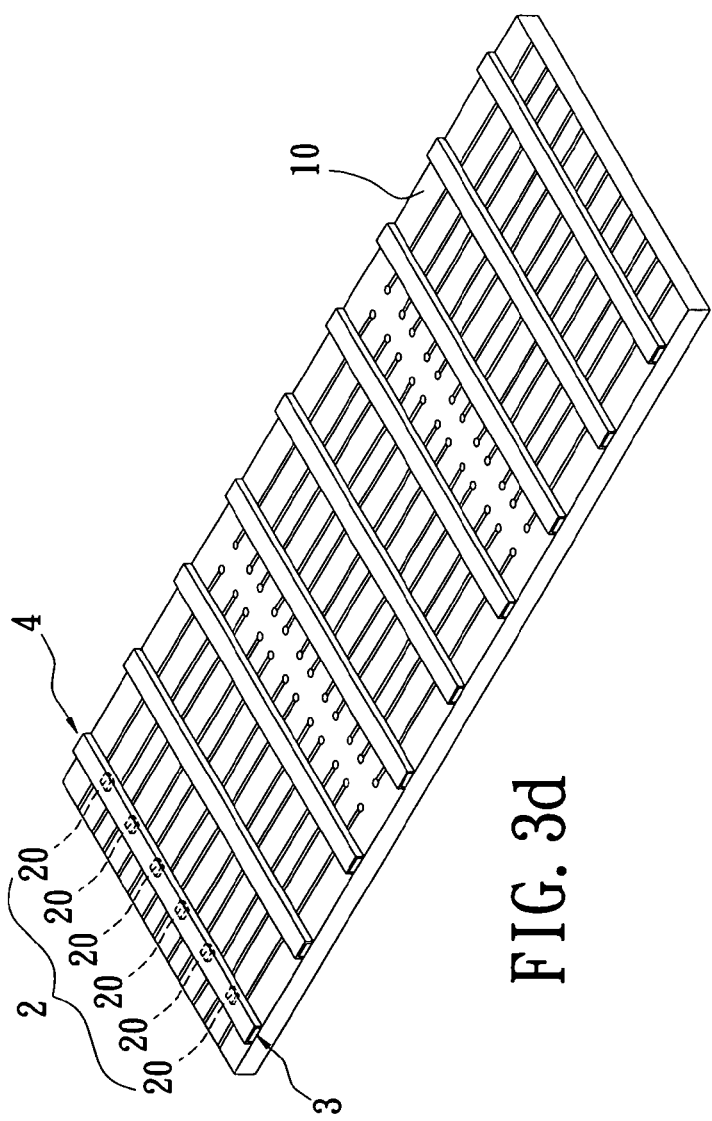
Figure 3D:
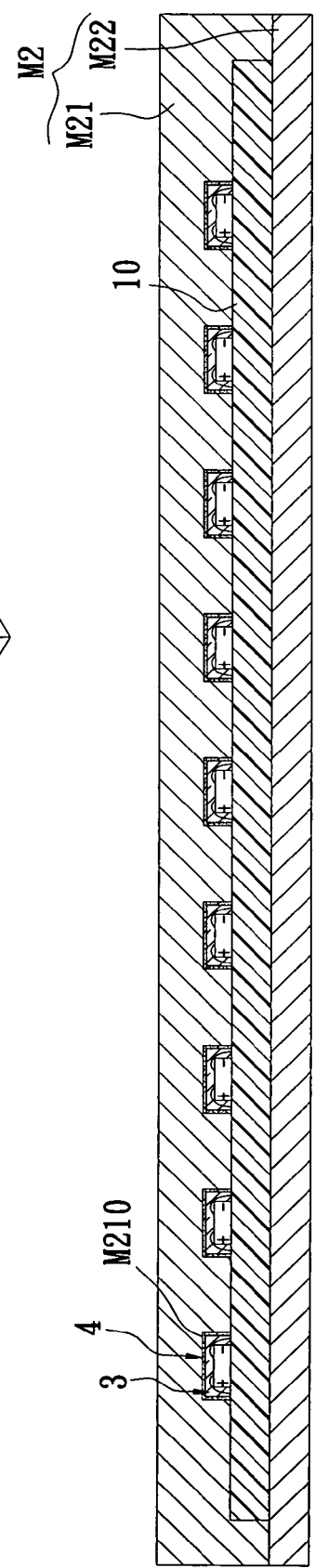

Moreover, referring to FIGS. 3d and 3D, the method of the first embodiment further includes: longitudinally and respectively covering the whole elongated transparent colloid bodies 3 with a plurality of elongated fluorescent colloid bodies 4 via a second mold unit M2 (S106).

The second mold unit M2 is composed of a second upper mold M21 and a second lower mold M22 for supporting the substrate body 10. The second upper mold M21 has a plurality of second channels M210 corresponding to the elongated transparent colloid bodies 3. The height and the width of each second channel M210 are equal to the height and the width of each elongated fluorescent colloid body 4. Moreover, according to different needs, each elongated fluorescent colloid body 3 can be formed by mixing silicon and fluorescent powders or by mixing epoxy and fluorescent powders.

Figure 3E:
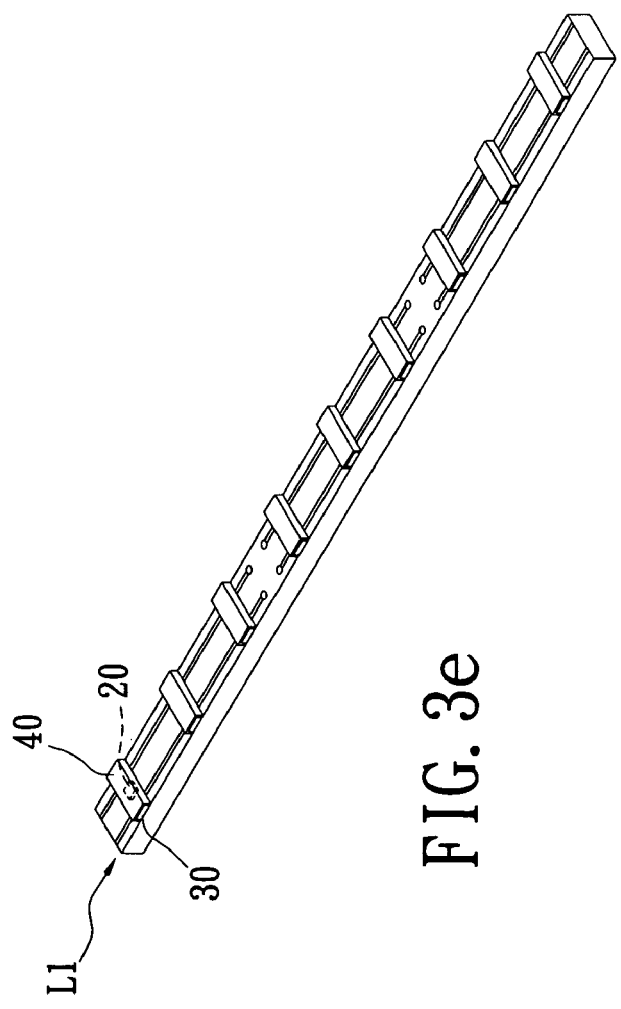
Figure 3E:
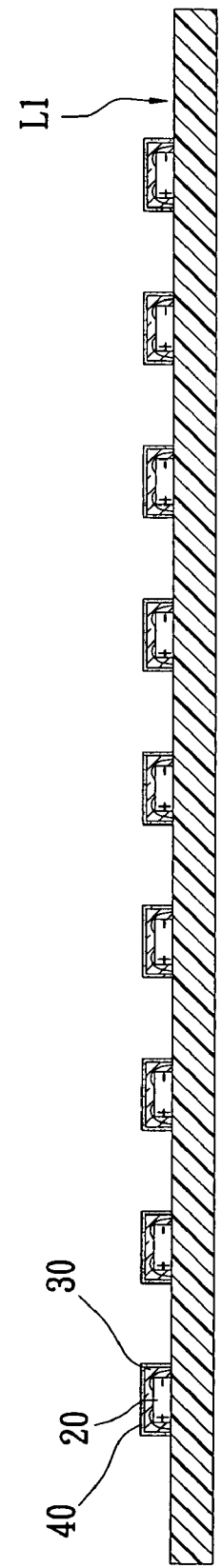

Finally, Referring to FIGS. 3d, 3e and 3E, the method of the first embodiment further includes: transversely cutting the elongated transparent colloid bodies 3, the elongated fluorescent colloid bodies 4 and the substrate body 10 along a line between each two adjacent and longitudinal LED chips 20 to form a plurality of light bars L1, and each light bar L1 having a plurality of transparent colloid bodies 30 that are separated from each other and respectively covering the LED chips 20 and a plurality of fluorescent colloid bodies 40 that are separated from each other and respectively covering the transparent colloid bodies 30 (S108).

Referring to FIGS. 5, 5a to 5d, and 5A to 5D, the steps S200 to S204 of the second embodiment are same as the steps S100 to S104 of the first embodiment. In other words, the illustration of S200 is the same as FIGS. 3a and 3A of the first embodiment, the illustration of S202 is the same as FIGS. 3b and 3B of the first embodiment, and the illustration of S204 is the same as FIGS. 3c and 3C of the first embodiment.

Figure 5A:
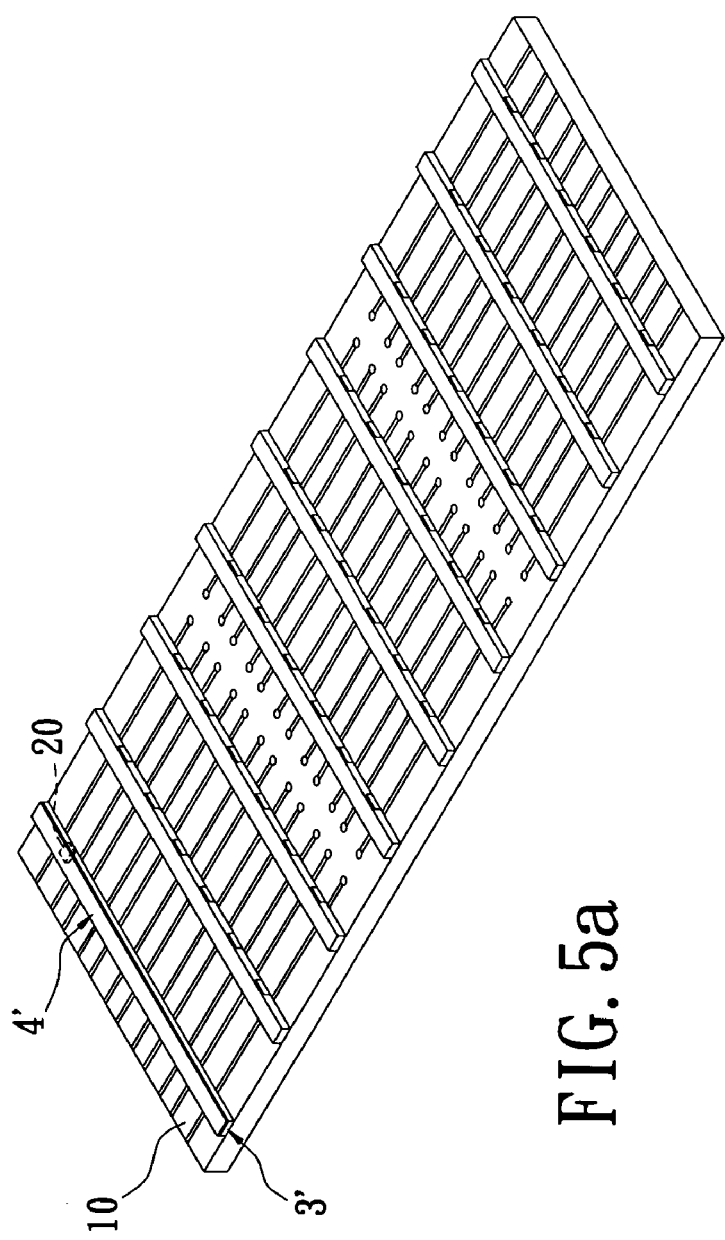
Figure 5A:
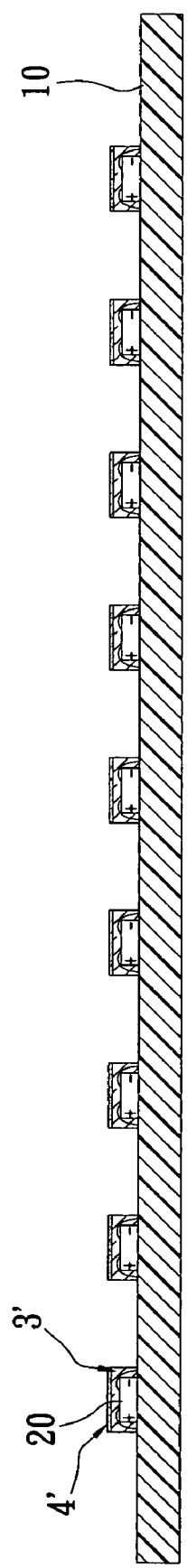

After the step of S204, referring to FIGS. 5a and 5A, the method of the second embodiment further includes: longitudinally and respectively covering the top surfaces of the elongated transparent colloid bodies 3' with a plurality of elongated fluorescent colloid bodies 4' (S206).

Figure 5B:
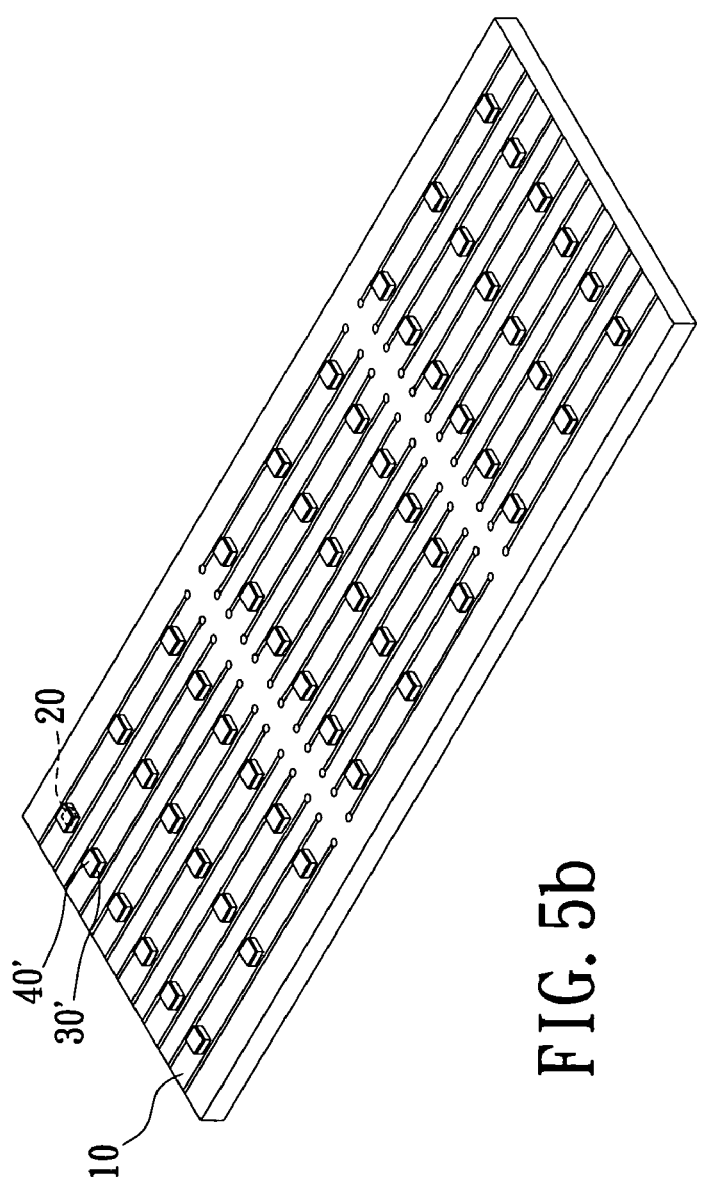
Figure 5B:
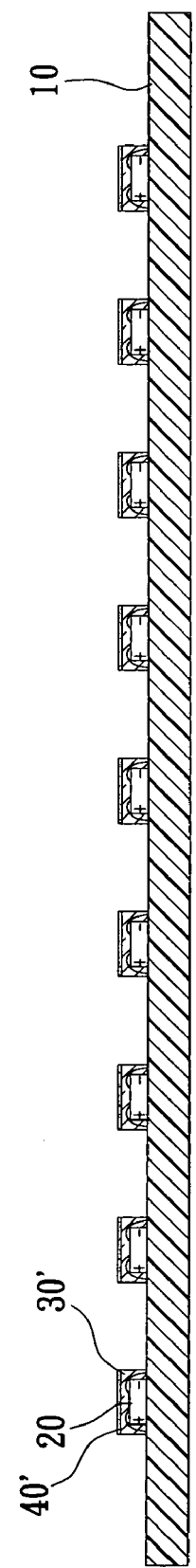

Referring to FIGS. 5b and 5B, the method of the second embodiment further includes: transversely cutting the elongated transparent colloid bodies 3' and the elongated fluorescent colloid bodies 4' along a line between each two adjacent and longitudinal LED chips 20 to form a plurality of transparent colloid bodies 30' that are separated from each other and respectively covering the LED chips 20 and a plurality of fluorescent colloid bodies 40' that are separated from each other and respectively covering the transparent colloid bodies 30' (S208).

Furthermore, referring to FIG. 5c and 5C, the method of the second embodiment further includes: covering substrate body 10 with a frame unit 5 via a third mold unit M3, and the frame unit 5 formed around the peripheries of each transparent colloid body 30' and each fluorescent colloid body 40' (S210). The third mold unit M3 is composed of a third upper mold M31 and a third lower mold M32 for supporting the substrate body 10. The third upper mold M31 has a third channel M310 corresponding to the frame unit 5. The height of the third channel M310 is equal to the distance from the top side of the substrate body 10 to the top side of the fluorescent colloid body 40', and the width of the third channel M310 is equal to the width of the frame unit 5.

Figure 5D:
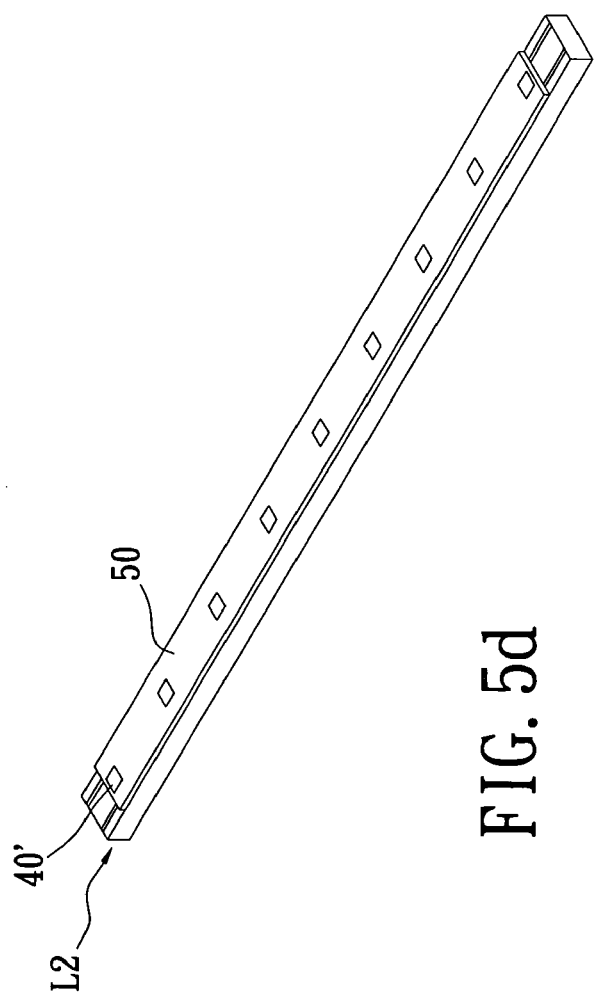
Figure 5D:
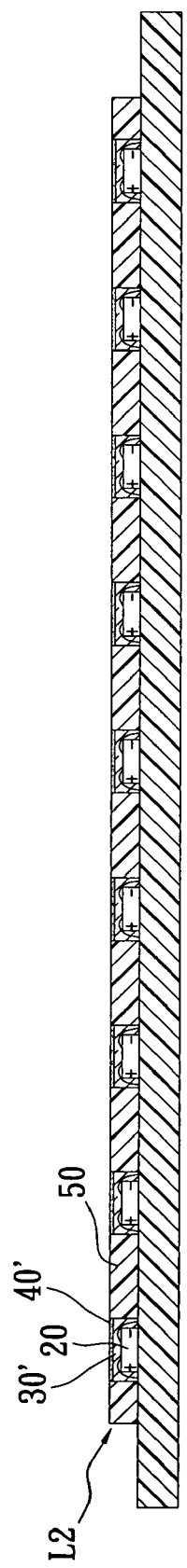

Finally, referring to FIG. 5c, 5d and 5D, the method of the second embodiment further includes: transversely cutting the frame unit 5 and the substrate body 10 along a line between each two adjacent and longitudinal LED chips 20 to form a plurality of light bars L2, and each light bar L2 having a frame layer 50 covering the peripheries of each transparent colloid body 30' and each fluorescent colloid body 40' (S212). In addition, the frame layer 50 can be an opaque frame layer, and the opaque frame layer is a white frame layer.

Figure 6:
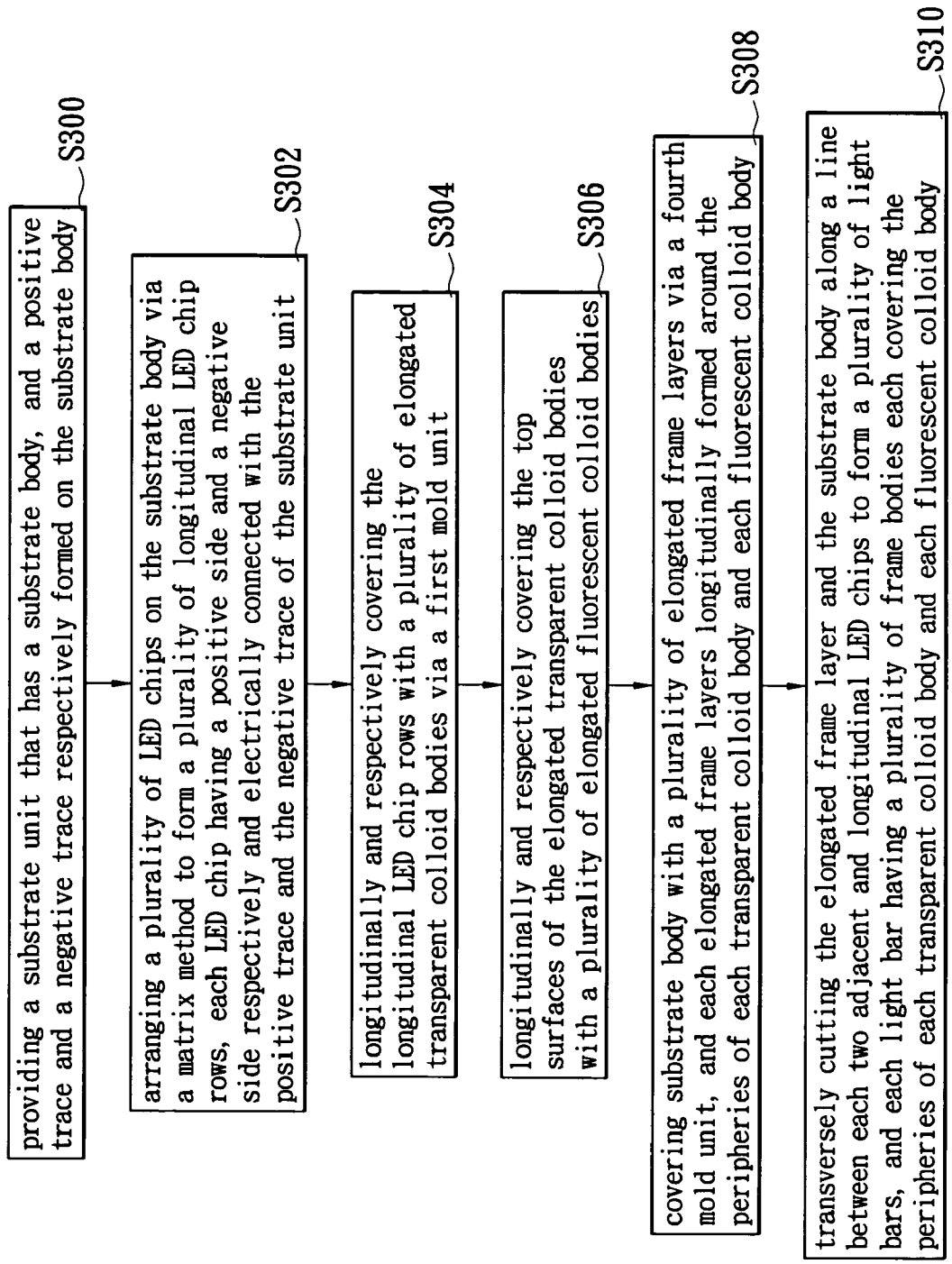
FIG. 6 is a flowchart of a method for making an LED chip package structure according to the third embodiment of the present invention.
Figure 6A:
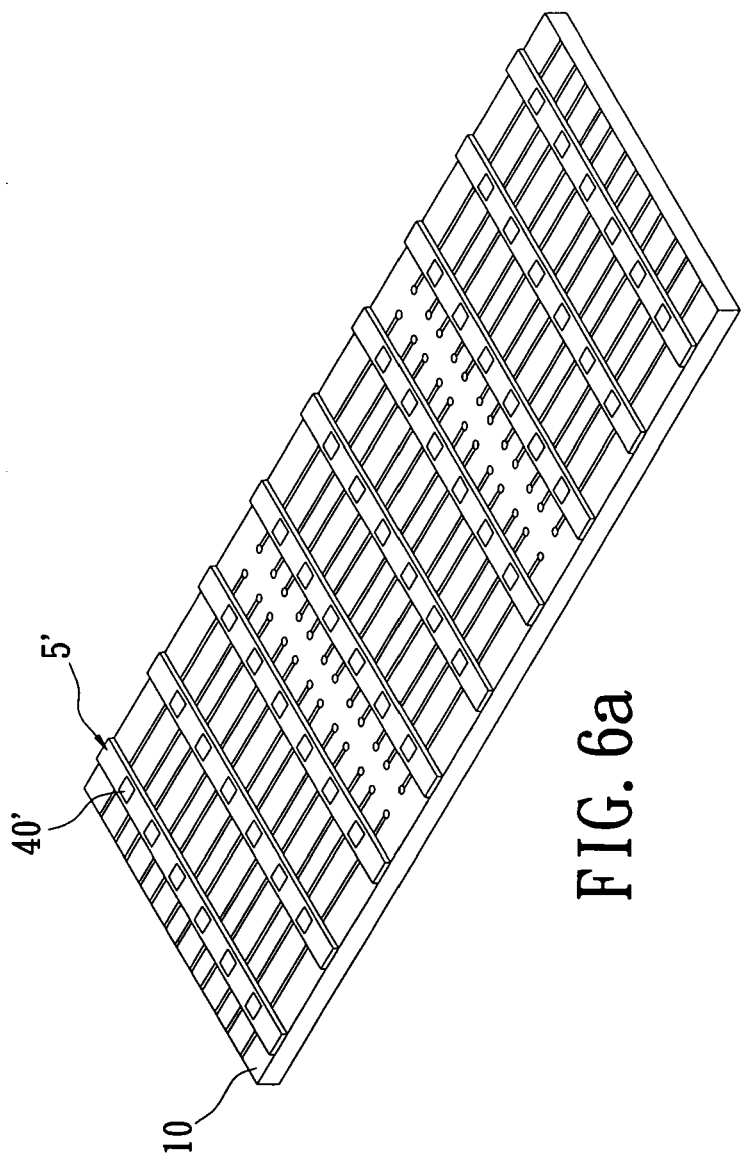
FIGS. 6a to 6b are partial perspective, schematic diagrams of a packaging process according to the third embodiment of the present invention, respectively.
Figure 6A:
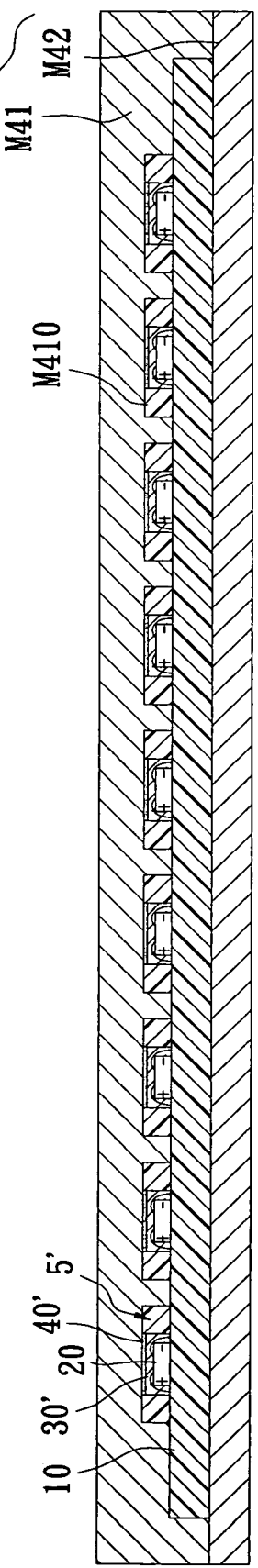
Figure 6B:
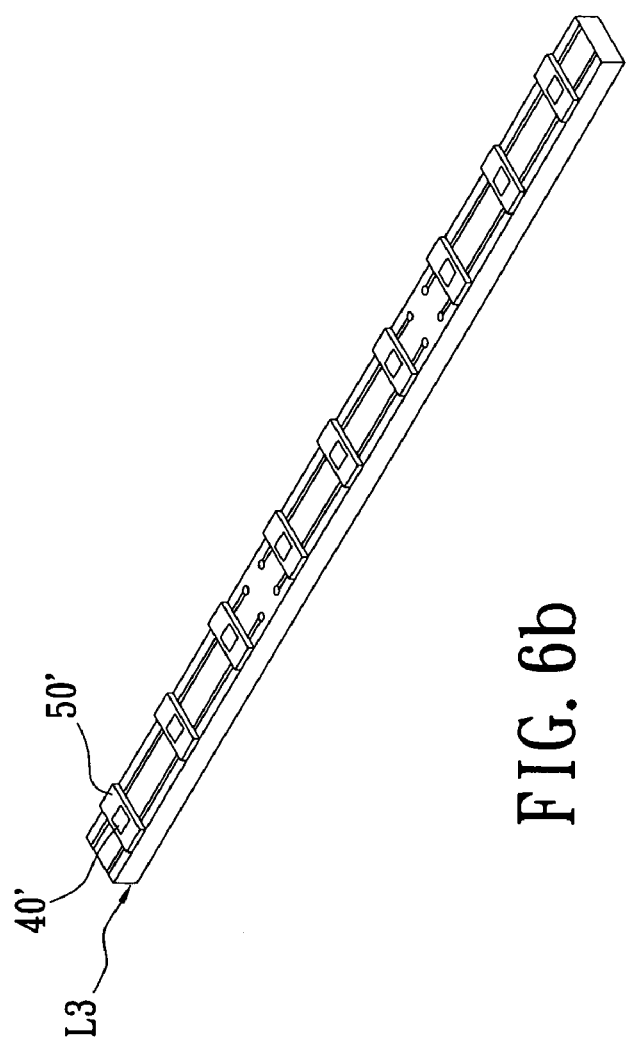
Figure 6B:
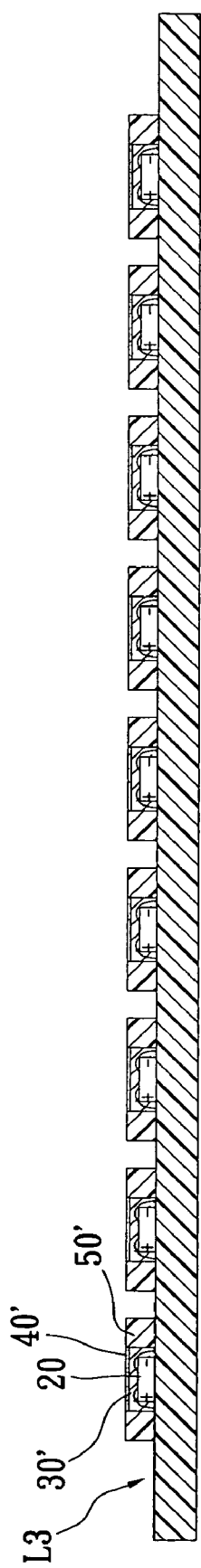

Referring to FIGS. 6, 6a to 6b, and 6A to 6B, the steps S300 to S304 of the third embodiment are same as the steps S100 to S104 of the first embodiment, and the step of S306 of the third embodiment is same as the step of S206 of the second embodiment. In other words, the illustration of S300 is the same as FIGS. 3a and 3A of the first embodiment, the illustration of S302 is the same as FIGS. 3b and 3B of the first embodiment, the illustration of S304 is the same as FIGS. 3c and 3C of the first embodiment, and the illustration of S306 is the same as FIGS. 5a and 5A of the second embodiment.

After the step of S306, referring to FIGS. 6a and 6A, the method of the third embodiment further includes: covering substrate body 10 with a plurality of elongated frame layers 5' via a fourth mold unit M4, and each elongated frame layers 5' longitudinally formed around the peripheries of each transparent colloid body 30' and each fluorescent colloid body 40' (S308). Moreover, the fourth mold unit M4 is composed of a fourth upper mold M41 and a fourth lower mold M42 for supporting the substrate body 10. The fourth upper mold M41 has a plurality of fourth channels M410 corresponding to the longitudinal LED chip rows 2. The height of the fourth channel M410 is equal to the distance from the top side of the substrate body 10 to the top side of the fluorescent colloid body 40', and the width of the fourth channels M410 is larger than the width of each transparent colloid body 30' or each fluorescent colloid body 40'.

Finally, referring to FIGS. 6a, 6b, and 6B, the method of the third embodiment further includes: transversely cutting the elongated frame layer 5' and the substrate body 10 along a line between each two adjacent and longitudinal LED chips 20 to form a plurality of light bars L3, and each light bar L3 having a plurality of frame bodies 50' each covering the peripheries of each transparent colloid body 30' and each fluorescent colloid body 40' (S310). Moreover, each frame body 50' can be an opaque frame body, and the opaque frame body is a white frame body.

Referring to FIGS. 7a and 7A, each light bar L4 has a plurality of LED chips 20 electrically disposed on a substrate body 10. Each transparent colloid body 30'' is formed on each LED chip 20. In addition, the top surface of each transparent colloid body 30'' is a cambered colloid surface 300'' and the front surface of each transparent colloid body 30'' has a light-outputting colloid surface 301'' formed in front of its cambered colloid surface 300''. Each fluorescent colloid body 40'' is covering the light-outputting colloid surfaces 301'' of the transparent colloid bodies 30''. Each frame body 50'' is formed on the cambered colloid surface 300'' of each transparent colloid body 30''.

In conclusion, when the LED chip package structure of the present invention lights up, the LED chip package structure generates a series of light-generating areas on a colloid body unit. Because the series of light-generating areas is continuous, no dark bands are produced between each two LED chips. Furthermore, because the LED chips are arranged on a substrate body via a COB (Chip On Board) method and a hot pressing method, the process of the LED chip package structure is simple and therefore reduces the required manufacturing time. Furthermore, the LED chip package structure can be applied to any type of light source such as a back light module, a decorative lamp, a lighting lamp, or a scanner.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:
1. An LED chip package structure, comprising:
a substrate unit;
a light-emitting unit including a plurality of LED chips disposed on the substrate unit and electrically connected to the substrate unit;
a transparent colloid unit including a plurality of transparent colloid bodies to respectively cover the LED chips, wherein each transparent colloid body has a cambered surface and a light-emitting surface respectively formed on a top surface and a front surface thereof, and the cambered surface is extended upwards and forwards from a top surface of the substrate unit and the light- emitting surface is extended downwards from a top end of the cambered surface to the top surface of the substrate unit;

a fluorescent colloid body unit including a plurality of fluorescent colloid bodies, wherein each fluorescent colloid body has a first lateral surface covering the light-emitting surface of each corresponding transparent colloid body; and a frame unit including a plurality of opaque frame bodies formed on the substrate unit and separated from each other to respectively cover the light-emitting surfaces of the transparent colloid bodies, wherein each fluorescent colloid body is disposed between each corresponding opaque frame body and the substrate unit, and each fluorescent colloid body has a second lateral surface exposed from the lateral surface of each corresponding opaque frame body.

2. The LED chip package structure as claimed in claim 1, wherein the second lateral surface of each fluorescent colloid body is substantially flushed with the lateral surface of each corresponding opaque frame body.

3. The LED chip package structure as claimed in claim 1, wherein each transparent colloid body is enclosed by matching each corresponding opaque frame body, each corresponding fluorescent colloid body, and the substrate unit.

* * * * *